(12) United States Patent
Lammers

(10) Patent No.: US 9,128,165 B2
(45) Date of Patent: Sep. 8, 2015

(54) BATTERY CELL IMPEDANCE MEASUREMENT METHOD AND APPARATUS

(75) Inventor: Matheus Johannes Gerardus Lammers, Nederweert (NL)

(73) Assignee: DATANG NXP SEMICONDUCTORS CO., LTD., Jiangsu (CN)

( * ) Notice: Subject to any disclaimer, the term of this patent is extended or adjusted under 35 U.S.C. 154(b) by 621 days.

(21) Appl. No.: 13/100,652

(22) Filed: May 4, 2011

(65) Prior Publication Data

US 2012/0280693 A1    Nov. 8, 2012

(51) Int. Cl.
    *G01N 27/42*    (2006.01)
    *G01R 31/36*    (2006.01)
    *H01M 10/48*    (2006.01)
    *H01M 10/44*    (2006.01)
    *H02J 7/00*    (2006.01)
    *H01M 10/42*    (2006.01)

(52) U.S. Cl.
    CPC ........... *G01R 31/3662* (2013.01); *H01M 10/44* (2013.01); *H01M 10/48* (2013.01); *H01M 10/482* (2013.01); *H02J 7/0019* (2013.01); *H01M 2010/4271* (2013.01); *Y02T 10/7055* (2013.01)

(58) Field of Classification Search
    CPC .................................................. G01R 31/3662
    USPC ......................................... 324/430, 525, 600
    See application file for complete search history.

(56) References Cited

U.S. PATENT DOCUMENTS

| | | | |
|---|---|---|---|
| 3,967,100 A | | 6/1976 | Shimomura |
| 3,978,326 A | | 8/1976 | Shimomura |
| 4,510,437 A | * | 4/1985 | Iskander ....................... 324/663 |
| 4,935,692 A | * | 6/1990 | Wakasugi ..................... 324/607 |
| 6,002,238 A | * | 12/1999 | Champlin ..................... 320/134 |
| 6,262,563 B1 | * | 7/2001 | Champlin ..................... 320/134 |
| 6,581,016 B1 | * | 6/2003 | Yukawa .......................... 702/65 |

(Continued)

FOREIGN PATENT DOCUMENTS

| | | | |
|---|---|---|---|
| CN | 1300945 A | | 6/2001 |
| CN | 1300945 A | * | 6/2001 |
| CN | 1929188 A | | 3/2007 |

OTHER PUBLICATIONS

Alan Chang and Mr. Kuang, "Complex Numbers and Trigonometric Identities", Mar. 12, 2000.*

(Continued)

*Primary Examiner* — Richard Isla Rodas
*Assistant Examiner* — Michael Dibenedetto
(74) *Attorney, Agent, or Firm* — Foley & Lardner LLP; James F. Ewing; Paul M. H. Pua

(57) ABSTRACT

A circuit arrangement for determining impedance of a battery cell is provided. A first circuit is configured to generate sine and cosine waveforms having N sample values per period. A second circuit is coupled to an output of the first circuit and is configured to input a current into the cell in response to the sample values of the cosine waveform. The current has an amplitude proportional to the sample values of the cosine waveform. A third circuit is coupled to the cell and configured to sample voltage levels across the cell resulting from the current being input into the cell. A fourth circuit is coupled to an output of the third circuit and is configured to separate each voltage level sampled by the third circuit into real and imaginary components.

19 Claims, 3 Drawing Sheets

(56) References Cited

U.S. PATENT DOCUMENTS

| | | | |
|---|---|---|---|
| 6,756,790 B2* | 6/2004 | Yakabe et al. | 324/649 |
| 6,778,913 B2 | 8/2004 | Tinnemeyer | |
| 6,812,715 B2* | 11/2004 | Chiozzi et al. | 324/691 |
| 7,253,631 B2* | 8/2007 | Petrescu et al. | 324/433 |
| 7,514,908 B2* | 4/2009 | Hosokawa et al. | 323/222 |
| 7,619,390 B2* | 11/2009 | Kim | 320/134 |
| 7,965,061 B2* | 6/2011 | Li et al. | 320/152 |
| 2005/0218915 A1 | 10/2005 | Tinnemeyer | |
| 2007/0052424 A1 | 3/2007 | Okumura | |
| 2008/0303528 A1* | 12/2008 | Kim | 324/430 |
| 2010/0237851 A1* | 9/2010 | Coster et al. | 324/76.19 |
| 2011/0125435 A1* | 5/2011 | Naumann et al. | 702/65 |
| 2011/0208452 A1* | 8/2011 | Mingant et al. | 702/63 |
| 2011/0215760 A1 | 9/2011 | van Lammeren | |
| 2011/0316344 A1 | 12/2011 | van Lammeren | |
| 2012/0032681 A1* | 2/2012 | Fink | 324/430 |
| 2012/0105070 A1 | 5/2012 | van Lammeren et al. | |

OTHER PUBLICATIONS

Jespersen, J.L. et al. "Capacity Measurement of Li-Ion Batteries Using AC Impedance Spectroscopy", World Electric Vehicle Journal, vol. 3, 7 pgs. (2009).

First Office Action for Chinese Patent Application No. 201210135136.4 mailed Mar. 31, 2014 (including English summary).

* cited by examiner

BATTERY CELL IMPEDANCE MEASUREMENT METHOD AND APPARATUS

FIELD OF THE DISCLOSURE

This disclosure generally relates to battery cells. More specifically, certain aspects of the disclosure relate to methods and apparatuses for measuring battery cell impedance.

BACKGROUND

In (hybrid) electric vehicles, large numbers of series-connected batteries are used to generate a high voltage to drive the motor. To maximize the life time of the battery cells (and drive range of the car), the State of Charge (SoC) should be maintained at an equivalent level between the battery cells.

DETAILED DESCRIPTION

Figure 1:
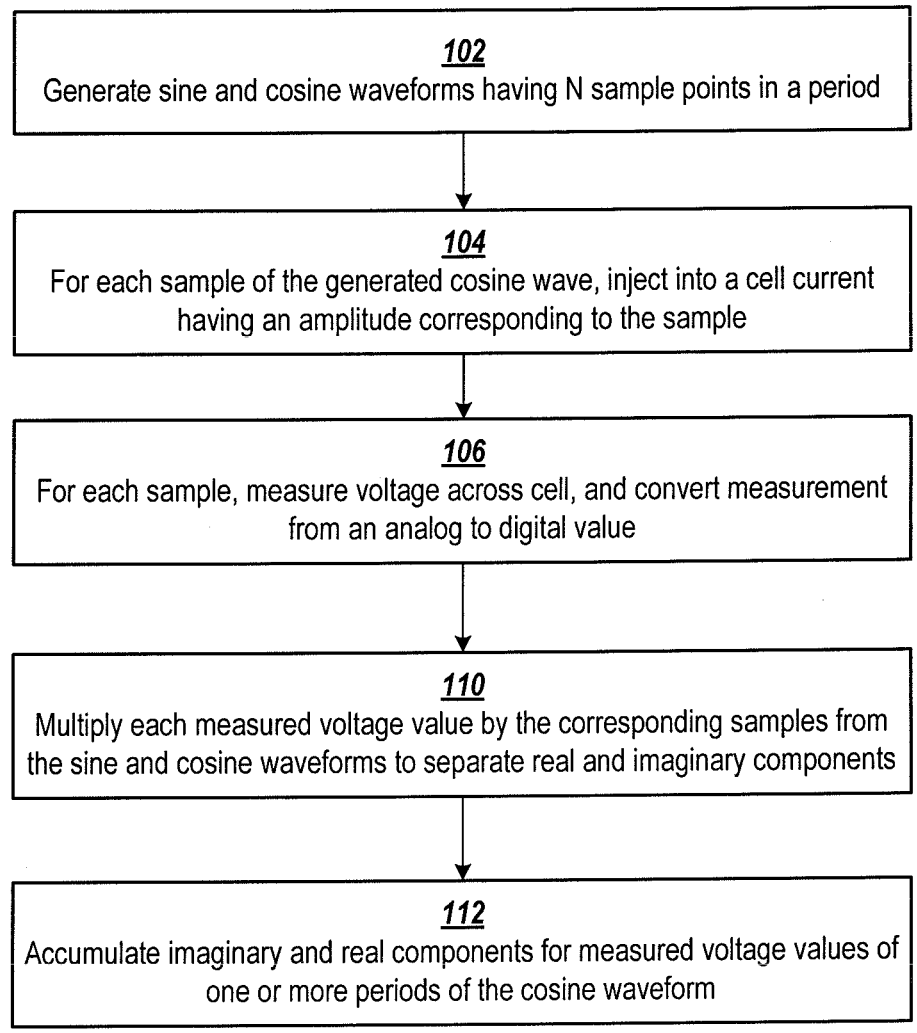
FIG. 1 shows a flowchart of a method for determining impedance of a battery cell(s)

When the battery cells in a series-connected string are charged, they all receive the same level of current. Thus, in principle the cells should be at the same SoC after charging. There are, however, mismatches between battery cells, such as susceptibility to leakage current, differences between cell capacities, and efficiency of converting current into chemically stored energy. Therefore, the SoCs of the battery cells will not be the same and drift apart over time, after charging and discharging. If no action is taken, the differences will grow with each charge/discharge cycle, leading to a reduction of the useable battery capacity and life time.

Such differences in SoCs can cause a battery cell to be over-discharged during use or over-charged in the charging process. For some battery chemistries, such as lithium-ion based batteries, over-charging or over-discharging may damage the battery cell. For example, a fully charged lithium ion cell often has a voltage that is close to the electrolyte breakdown threshold voltage at which damage to the cell may occur. If a cell is over-charged to the point where the voltage exceeds the electrolyte breakdown threshold voltage, the cell may be damaged. To prevent such damage, battery packs of series-coupled cells often include cell-balancing circuits that equalize the SoCs between the series-coupled cells. By balancing the SoCs of the cells at rest, during charge or discharge, cells may be prevented from becoming over-charged or over-discharged.

In implementing cell balancing, it is important to know the impedance of the battery cell(s). Impedance of the cell(s) (and the way it changes over time) helps to accurately estimate the SoC, state of function (SoF) and the state of health (SoH) of the battery pack. Impedance may also be used to implement optimal charge and discharge strategies to maximize battery life, cycle life, and utilize the available energy storage capacity of the battery pack.

One method to measure the impedance is to use electrochemical impedance spectroscopy (EIS), hereafter generally referred to as electroscopy. Electroscopy is a technique that determines the impedance of the battery at different frequencies. A source drives a current through the battery pack. The source may be either a voltage source or a current source. The voltage and/or current driven through a battery cell typically has a low amplitude, such that the battery can be regarded as a linear system at the measurement point. The current is converted into a voltage by a resistor connected in series with the battery. Band-pass filters eliminate unwanted signals (e.g. noise and distortion) before they can reach the amplitude and phase meters. The voltages across the battery and conversion resistor are measured with identical amplitude and phase meters. All meters and band-pass filters are identical to ensure equal gain and delay time in these circuits.

Real and imaginary parts of the battery's impedance are then determined from the amplitude and phase information of the measured voltages as indicated by, $$|Z_{bat}| = \frac{V_{bat}}{V_{conv}} R_{conv}$$

$$Re_{bat} = |Z_{bat}| \cdot \cos(\varphi_{bat})$$

$$Im_{bat} = |Z_{bat}| \cdot \sin(\varphi_{bat})$$

However, this method returns only the overall series resistance, not the complete impedance as a function of frequency. In battery cells, important chemical reactions have time-constants that range from milliseconds to many seconds. In order to capture all relevant information of these reactions, sampling needs to be performed with a frequency that is at least two times higher than the frequency associated with the shortest time constant of interest (Nyquist criterion).

Due in part to a low sampling rate that is limited by the indirect measurements and the response time of the band-pass filters this method cannot produce the complete impedance curve because the measured data does not contain all the information needed to find the impedance curve at high frequencies.

One or more embodiments may address one or more of the above issues.

In one embodiment, a circuit arrangement for determining impedance of a battery cell is provided. A first circuit is configured to generate sample values representative of a sine waveform and a cosine waveform. N sample values are used to represent each period of the respective sine and cosine waveforms. A second circuit is coupled to an output of the first circuit and is configured to input a current into the battery cell in response to the sample values of the cosine waveform. The current has an amplitude proportional to the sample values of the cosine waveform. A third circuit is coupled to the cell and configured to sample voltage levels across the cell resulting from the current being input into the cell. A fourth circuit is coupled to an output of the third circuit and is configured to separate each voltage level sampled by the third circuit into real and imaginary components.

In another embodiment, a method for determining impedance of a battery cell is provided. Sine and cosine waveforms having N sample points per period are generated. For each sample point of the cosine waveform, a current having an amplitude corresponding to a value of the sample point is injected into a battery cell. A voltage level across the cell is measured and converted from an analog to a digital value. The digital value of the voltage is separated into real and imaginary components. The real component of N digital values are summed to determine a real component of the impedance of the battery cell. The imaginary component of the N digital values are summed to determine an imaginary component of the impedance of the battery cell.

In yet another embodiment, an energy storage cell arrangement is provided. The energy storage cell arrangement includes a plurality of battery cells coupled in series and an impedance detection circuit coupled to one of the plurality of battery cells. The impedance detection circuit includes a first circuit configured to generate sample values representative of a sine waveform and a cosine waveform. N sample values represent each period of the sine and cosine waveforms. A second circuit is coupled to an output of the first circuit and is configured to input a current into the one of the plurality of battery cells in response to the sample values of the cosine waveform. The current injected into the cell has an amplitude proportional to the sample values of the cosine waveform. A third circuit is coupled to the one of the plurality of battery cells and is configured to sample voltage levels across the one battery cell resulting from the current being input into the one battery cell. A fourth circuit is coupled to an output of the third circuit and is configured to multiply each voltage level sampled by the third circuit with a sine waveform to generate the imaginary component and multiply each voltage level sampled by the third circuit with a cosine waveform to generate the real component. The real component of N of the voltage levels sampled by the third circuit are summed to determine a real component of the impedance of the one battery cell. The imaginary component of N of the voltage levels sampled are summed to determine an imaginary component of the impedance of the one battery cell.

The above discussion is not intended to describe each embodiment or every implementation. Various example embodiments may be more completely understood in consideration of the following detailed description in connection with the accompanying drawings, in which:

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

In one or more embodiments, the cell impedance is determined by modulating current through a cell according to known frequency spectrum. Resulting voltages exhibited across the cell are digitized and processed to derive the cell impedances.

FIG. 1 shows a flowchart of a method for determining impedance of a battery cell(s). Corresponding sine and cosine waveforms are generated at block 102. Each of the waveforms include N sample points per period. For each sample point of the generated cosine waveform, a current pulse having an amplitude corresponding to the sample point is injected into a battery cell under test at block 104. For each sample point, a voltage exhibited across the cell as a result of the injection of the current, is measured and digitized at block 106. Each digitized voltage is separated into real and imaginary components at block 110. The digitized voltage is separated into respective real and imaginary components by multiplying the digitized voltage by the sample point of the waveforms used to generate the injected current.

Multiplication of the digitized voltage with the corresponding sample point of the cosine waveform produces the real component of the digitized voltage. Multiplication of the digitized voltage with the corresponding sample point of the sine waveform produces the imaginary component of the digitized voltage. Real and imaginary components are respectively accumulated for one or more periods of the cosine waveform at block 112 to produce the final real and imaginary parts of the cell impedance.

Figure 2:
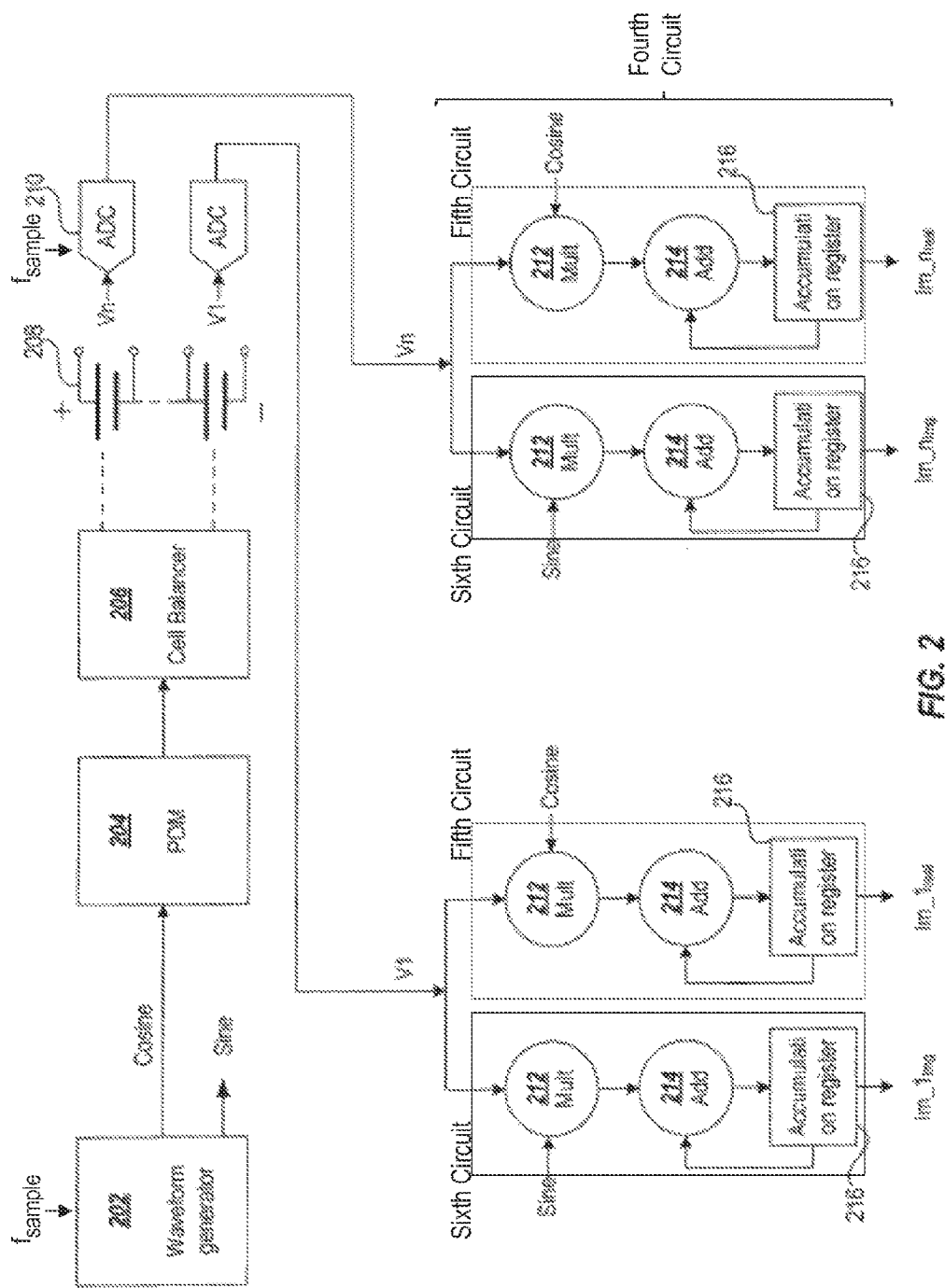
FIG. 2 shows a circuit for implementing the flow illustrated in FIG. 1.

FIG. 2 shows a circuit that calculates the cell impedance using the process of FIG. 1. In this illustrative example, a battery pack having a number of cells 208 is implemented with a cell balancing circuit 206. To determine the impedance of a cell 208, a current injected into the cell by the cell-balancer is controlled according to a known waveform. A voltage resulting from the injected current can be compared with the known waveform to determine impedance. The circuit includes a waveform generator 202 (hereafter sometimes generally referred to as "first circuit") that is configured to generate respective sine and cosine waveforms at a target frequency and sample rate. In some alternative embodiments, samples of the waveforms may be retrieved from a lookup table (LUT).

For each sample of a cosine waveform produced by waveform generator 202, pulse density modulator (PDM) circuit 204 causes cell balancer circuit 206 (circuits 204 and 206 are hereafter sometimes generally or collectively referred to as "second circuit") to inject a current pulse having a density proportional to the amplitude of the cosine waveform sample. A voltage is produced across the cell 208 as a result of the current pulse, and the voltage is measured and digitized by analog-to-digital converter (ADC) circuit 210 (hereafter sometimes generally referred to as "third circuit"). Each digitized voltage produced by the ADC 210 is separated into real and imaginary components using multiplication circuits 212 to multiply the digitized voltage by a corresponding sample of the respective sine and cosine waveforms.

In particular, the real component is isolated by multiplying 212 the digitized voltage with a scaled sample of the particular sample point of the cosine waveform generated by the waveform generator 202 and used to create the current pulse in cell 208 that resulted in the particular measured voltage. Similarly, the imaginary component is isolated by multiplying the digitized voltage with the corresponding sample of the sine waveform produced by the waveform generator 202 that is scaled by a calibration scalar. Scaling of the waveforms with a calibration scalar (not shown) is described in detail below.

The real and imaginary components are respectively accumulated for one or more periods of the cosine waveform by respective accumulators implemented with addition circuit 214 and accumulation register 216. As a result of the accumulation, real and imaginary portions of impedance of the cell are produced.

While the examples and embodiments are primarily described with reference to injection of a current modulated with a known waveform, one or more alternative embodiments may modulate a current drawn from the cell by a load with the known waveform.

While the examples and embodiments primarily use the generated cosine waveform to control current pulses, one or more alternative embodiments may use the generated sine waveform to control current pulses. In such embodiments, a real component of the digitized voltage is isolated by multiplication of the digitized voltage with the scaled sine waveform. Similarly, an imaginary component of the digitized voltage is isolated by the multiplication of the digitized voltage with the scaled cosine waveform.

The calculation of the cell impedance with the above methodology may be understood mathematically. If impedance is calculated correctly, the voltage samples from the ADC may be fitted on a waveform proportional to the cosine waveform generated by the waveform generator circuit. In this manner, impedance may be calculated by maximizing a fitness function, $$\text{fit}(\phi) = C + B^* \sin \phi_0^* \cos\phi + B^* \cos \phi_0^* \sin \phi$$

defined by the DC voltage offset (C), the amplitude of the sine (B) and the phase angle ($\phi_0$). Rewriting the function such that it contains a pure sine and cosine term, the amplitudes of the cosine (B sin $\phi_0$) and the sine (B cos $\phi_0$) terms correspond to the real and imaginary parts of the cell impedance.

Maximum fitness may be determined for all samples $\phi_0$ through $\phi_N$ of a period by placing the function into a linear form, $$A^*x = b$$

and solving for vector x, where A is a matrix that defines a linear combination of the DC offset, real, and imaginary components (vector x) of the fit function at the points where the samples are taken by the ADC (vector b).

$$A = \begin{bmatrix} 1 & C1 & S1 \\ \vdots & \ddots & \vdots \\ 1 & \dots Cn & Sn \end{bmatrix}$$

$$\bar{x} = \begin{bmatrix} DC \\ Z_{real} \\ Z_{img} \end{bmatrix}$$

$$b = \begin{bmatrix} y1 \\ y2 \\ \dots \\ yn \end{bmatrix}$$

Because the phase of each sampling point is known by design, the coefficients of matrix A correspond to the DC voltage offset (C) and the amplitude of the generated sine and cosine waveforms. Matrix A is constructed from the samples of generated sine and cosine waveforms over one period. Matrix A includes a row corresponding to each phase $\phi$ of the period. The first column includes DC voltage offsets corresponding to each phase $\phi$. For simplicity, the DC voltage offsets can be assumed to be one. The second column corresponds to the amplitudes of the samples of the generated cosine waveform, and the third column corresponds to the amplitudes of the samples of the generated sine waveform.

Solving the linear fitness equation ($A^*x = b$) for x, $$\bar{x} = M * b$$

where $$M = (A^T A)^{-1} A^T$$

$$M = \begin{bmatrix} 1/n & \dots & 1/n \\ C1' & \ddots & :Cn' \\ S1' & \dots & Sn' \end{bmatrix}$$

To find the values of the fit parameters, and solve for x, the matrix M may be calculated from the original sampling matrix A. It is recognized that the rows of matrix M have interesting properties. For example, the values of the first row are constant, all the same and equal to one over the number of samples in the data set (i.e., 1/N). The second row is a scaled version of the cosine and the third row is a scaled version of the sine.

The summation process must include exactly one or more complete cycles of the sine waveform. The result is proportional to the real and imaginary parts of the cell impedance at the measured frequency. A calibration scalar is required to find the absolute values of Re(Z) and Im(Z). The matrix M can also be written as shown below:

$$M = \frac{2}{N} \begin{bmatrix} 0.5 & \dots & 0.5 \\ C1 & \dots & Cn \\ S1 & \dots & Sn \end{bmatrix}$$

The values C1 ... Cn and S1 ... Sn, which are the same values used in matrix A, are scaled by 2/N to find the absolute values of Re(Z) and Im(Z).

Referring back to the circuit shown in FIG. 2, the sampled voltage from the ADC 210 is multiplied with scaled samples of the sine and cosine waveforms produced by the waveform generator 202. All sample points in a period of the waveforms are represented by respective second and third rows of matrix $A^T$, with each column corresponding to a phase of the period. Scaling of all of the sample points corresponds to the multiplication of matrix $A^T$ by $(A^T A)^{-1}$ shown in the above equations.

The accumulation of the real components performed by the circuit is equivalent to the multiplication of the second row of matrix M with vector b. Similarly, the accumulation of the imaginary components is equivalent to the multiplication of the third row of matrix M with vector b. In this manner, as each voltage is measured by ADC 210, a column of matrix M is multiplied with the vector b by multiplication circuits 212. The resulting products are added to the previously stored values in the real and imaginary accumulator registers 216. For example, when the first sample $y_0$ of vector b arrives, it is multiplied by the first column of the matrix M and stored in the vector x. When the next sample $y_1$ of vector b arrives, it will be multiplied with the second column of the matrix, added to the previous result and stored in accumulation register 216 (added to the vector x). After all samples of at least one period are accumulated, the real and imaginary parts of the cell impedance are available in respective accumulation registers.

The first row of the matrix M is constant and equal to (1/N). As a result of the accumulation over N samples, the accumulated DC value of the cell voltage in one period is equal to one. The DC value is discarded for spectroscopy, and therefore, the DC accumulator is not required to be implemented in hardware.

Figure 3:
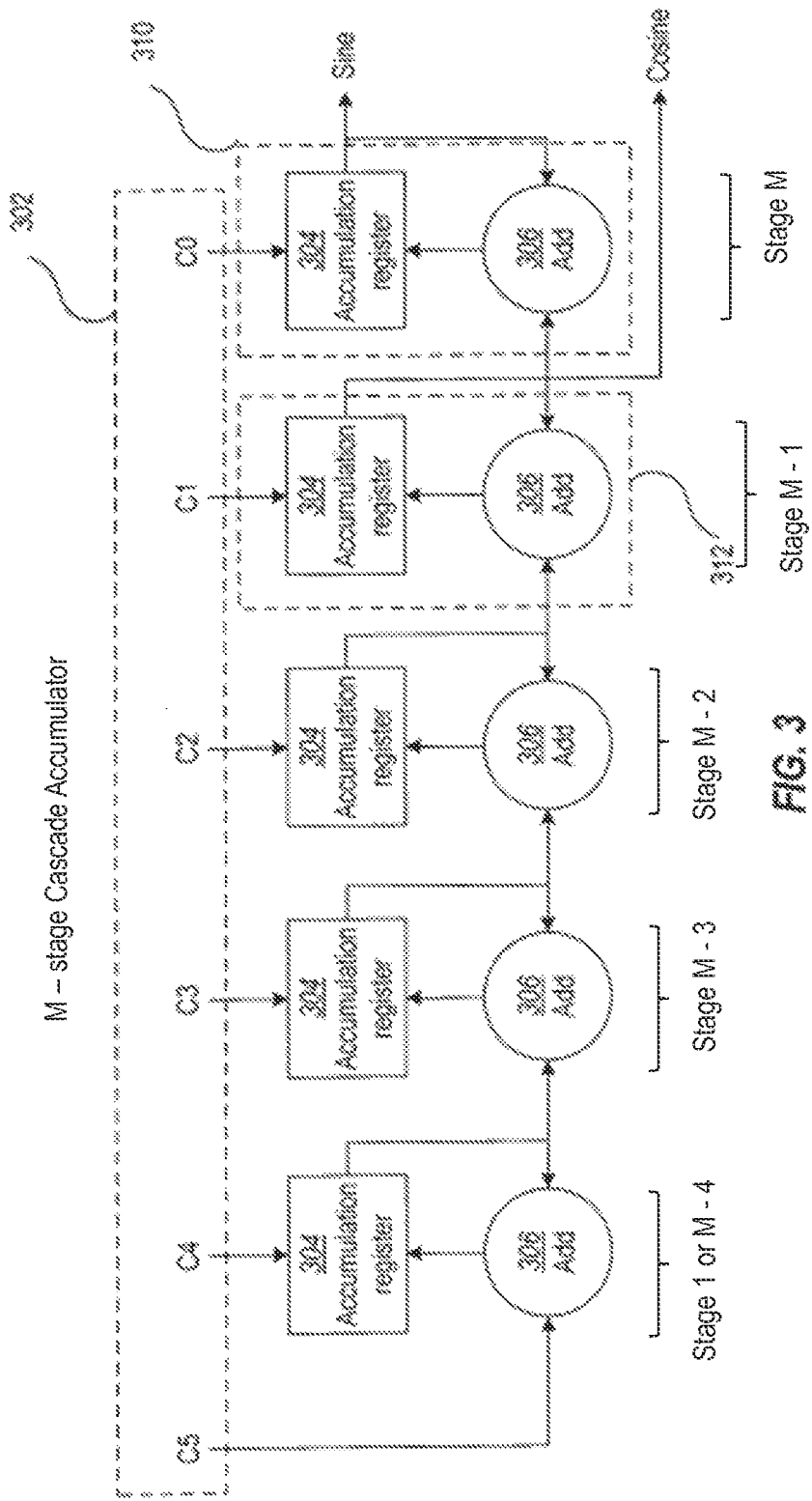
FIG. 3 shows an efficient example implementation of a waveform generator that may be used to generate desired sine and cosine waveforms.

FIG. 3 shows an efficient example implementation of a waveform generator that may be used to generate desired sine and cosine waveforms. In this example implementation, the circuit generates sine and cosine waveforms using six polynomial coefficients (C0 ... C5). For a sine/cosine waveform, the coefficients may be fixed and can be hardwired inside the IC. Alternately, the coefficients may be adjustable to set the generated waveforms to a frequency of interest.

Generation of the waveforms begins by loading the initial coefficients 302 into the accumulation registers 304. Each accumulation register 304 is coupled to an adder 306, and together the accumulation register and adder form an accumulator. Each subsequent sample is generated by propagating accumulated values between neighboring accumulators. For example, all accumulators will receive a new value that is equal to the sum of their current value and the value of the accumulation register corresponding to the next higher order polynomial coefficient.

The calculation of each step can be described in matrix form by the formula:

$$\vec{y}_{n+1} = \begin{bmatrix} 1 & 1 & 0 & 0 & 0 \\ 0 & 1 & 1 & 0 & 0 \\ 0 & 0 & 1 & 1 & 0 \\ 0 & 0 & 0 & 1 & 1 \\ 0 & 0 & 0 & 1 & 1 \\ 0 & 0 & 0 & 0 & 1 \end{bmatrix} \cdot \vec{y}_n$$

The vectors $y_n$ and $y_{n+1}$ describe the values stored in the accumulators before and after one accumulation step. The matrix represents the addition operation. The values of the accumulators can also be calculated after (n) steps starting from the initial values given by vector $y_o$ (determined by the coefficients $c_0 \ldots c_5$).

The output of the first accumulator 310, which corresponds to the first polynomial coefficient, produces the generated sine waveform. The output of the second accumulator 312, which corresponds to the first polynomial coefficient, is approximately equal to the first derivative of the output of the first accumulator 310, and may be used to produce the cosine waveform.

For example, for an approximated function of a sine waveform $y = x - x^3/6 + x^5/120$, the function of the corresponding cosine waveform is given by $dy/dx = 1 - x^2/2 + x^4/24$. Although cosine is generated with a lower order function, if the step size of x is small (as in the sine/cosine case), the second accumulator 312 provides a good approximation for the first derivative. Because samples are accumulated over an entire period, any error induced in the approximation of the derivative will statistically be averaged out. Therefore, the circuit shown in FIG. 3 provides a hardware-efficient implementation of the waveform generator.

Based upon the above discussion and illustrations, those skilled in the art will readily recognize that various modifications and changes may be made without strictly following the exemplary embodiments and applications illustrated and described herein. Such modifications do not depart from the true spirit and scope of the present disclosure, including that set forth in the following claims.

What is claimed is:

1. A circuit arrangement for determining impedance of a battery cell, the circuit comprising:
   a first circuit configured to generate sample values representative of a sine waveform and a cosine waveform at a target frequency and sample rate, with each period of the sine waveform including N sample values and each period of the cosine waveform including N sample values;
   a second circuit coupled to an output of the first circuit and configured to input a current into the cell in response to the sample values of the cosine waveform, the current having an amplitude proportional to the sample values of the cosine waveform;
   a third circuit coupled to the cell and configured to sample voltage levels across the cell resulting from the current being input into the cell, the third circuit is configured to sample voltage levels at a sample rate equal to a sample rate of the cosine waveform; and
   a fourth circuit coupled to an output of the third circuit and configured to separate each voltage level sampled by the third circuit into real and imaginary components.

2. The circuit arrangement of claim 1, wherein the fourth circuit is configured to separate each sampled voltage level into real and imaginary components by:
   multiplying each voltage level sampled by the third circuit with a sine waveform to generate the imaginary component; and
   multiplying each voltage level sampled by the third circuit with a cosine waveform to generate the real component.

3. The circuit arrangement of claim 2, wherein the fourth circuit is configured to separate each sampled voltage level into real and imaginary components by:
   multiplying each voltage level sampled by the third circuit with the sine waveform generated by the first circuit scaled by a calibration scalar to generate the imaginary component; and
   multiplying each voltage level sampled by the third circuit with the cosine waveform of the first circuit scaled by a calibration scalar to generate the real component.

4. The circuit arrangement of claim 2, wherein the fourth circuit is further configured to:
   sum the real components of N of the voltage levels sampled by the third circuit to determine a real component of the impedance of the battery cell; and
   sum the imaginary components of the N of the voltage levels sampled to determine an imaginary component of the impedance of the battery cell.

5. The circuit arrangement of claim 4, wherein the fourth circuit includes:
   a fifth circuit coupled and configured to receive and accumulate the generated real component of the voltage levels sampled by the third circuit; and
   a sixth circuit coupled and configured to receive and accumulate the generated imaginary component of the voltage levels sampled by the third circuit.

6. The circuit arrangement of claim 1, wherein the second circuit is configured and arranged to input the current into the cell by generating a current pulse having a density proportional to at least one of the sampled values.

7. The circuit arrangement of claim 1, wherein the third circuit is further configured to convert sampled voltage levels from analog to digital values.

8. The circuit arrangement of claim 1, wherein the second circuit, includes:
   a cell balancing circuit configured to balance energy stored in a plurality of cells including the battery cell; and
   a pulse density modulation circuit configured to drive transistor gates of the cell balancing circuit.

9. The circuit arrangement of claim 4, wherein the fourth circuit determines a frequency domain equivalent value of the voltage levels sampled by the third circuit for a frequency band corresponding to the frequency of the cosine waveform.

10. The circuit arrangement of claim 1, wherein the first circuit is a polynomial waveform generator configured to:
   calculate the sine waveform using M polynomial coefficients; and
   calculate the cosine waveform using M−1 of the M polynomial coefficients.

11. The circuit arrangement of claim 10, wherein the first circuit is an M-stage cascade accumulator, the output of the stage M producing the sine waveform, and the output of the stage M−1 producing the cosine waveform.

12. A method for determining impedance of a battery cell, the method comprising:
   generating sine and cosine waveforms at a target frequency and sample rate, each period of each of the waveforms having N sample points;
   for each sample point of the cosine waveform:

injecting a current having an amplitude corresponding to a value of the sample point into a battery cell;
converting a voltage level across the cell from an analog to a digital value at a sample rate equal to the sample rate of the cosine waveform; and
separating the digital value of the voltage into real and imaginary components;
summing the real component of N digital values to determine a real component of the impedance of the battery cell; and
summing the imaginary component of the N digital values to determine an imaginary component of the impedance of the battery cell.

13. The method of claim 12, wherein the digital value of the voltage is separated into real and imaginary components by:
multiplying the digital value with the sine waveform to generate the imaginary component; and
multiplying the digital value with the cosine waveform to generate the real component.

14. The method of claim 13, wherein the digital value of the voltage is separated into real and imaginary components by:
multiplying the digital value with the sine waveform scaled by a calibration scalar to generate the imaginary component; and
multiplying the digital value with the cosine waveform scaled by a calibration scalar to generate the real component.

15. The method of claim 12, wherein summing of the real components is performed by accumulating real components as they are generated.

16. An energy storage cell arrangement, comprising:
a plurality of battery cells coupled in series; and
an impedance detection circuit coupled to one of the plurality of battery cells, the impedance detection circuit including:
a first circuit configured to generate sample values representative of a sine waveform and a cosine waveform at a target frequency and sample rate, with each period of the sine waveform including N sample values and each period of the cosine waveform including N sample values;
a second circuit coupled to an output of the first circuit and configured to input a current into the one of the plurality of battery cells in response to the sample values of the cosine waveform, the current having an amplitude proportional to the sample values of the cosine waveform;
a third circuit coupled to the one of the plurality of battery cells and configured to sample voltage levels across the one battery cell resulting from the current being input into the one battery cell, the sampling voltage levels being at a sample rate equal to the sample rate of the cosine waveform; and
a fourth circuit coupled to an output of the third circuit and configured to:
multiply each voltage level sampled by the third circuit with the sine waveform of the first circuit to generate the imaginary component;
multiply each voltage level sampled by the third circuit with the cosine waveform of the first circuit to generate the real component;
sum the real component of N of the voltage levels sampled by the third circuit to determine a real component of the impedance of the one battery cell; and
sum the imaginary component of the N of the voltage levels sampled to determine an imaginary component of the impedance of the one battery cell.

17. The energy storage cell arrangement of claim 16, wherein the second circuit is further configured to input the current into a second one of the plurality of battery cells in response to the sample values of the cosine waveform.

18. The energy storage cell arrangement of claim 17, further comprising:
a fifth circuit coupled to the second one of the plurality of battery cells and configured to sample voltage levels across the second one battery cell resulting from the current being input into the second one battery cell; and
a sixth circuit coupled to an output of the fifth circuit and configured to:
multiply each voltage level sampled by the fifth circuit with the sine waveform of the first circuit to generate the imaginary component;
multiply each voltage level sampled by the third circuit with the cosine waveform of the first circuit to generate the real component;
sum the real component of N of the voltage levels sampled by the fifth circuit to determine a real component of the impedance of the one battery cell; and
sum the imaginary component of the N of the voltage levels sampled by the fifth circuit to determine an imaginary component of the impedance of the one battery cell.

19. The energy storage cell arrangement of claim 16, wherein
the fourth circuit is configured to scale the sine and cosine waveforms of the first circuit by a calibration scalar;
the sine waveform of the first circuit that is multiplied by the fourth circuit with each voltage level sampled by the third circuit is the sine waveform of the first circuit scaled by the calibration scalar, and
the cosine waveform of the first circuit that is multiplied by the fourth circuit with each voltage level sampled by the third circuit is the cosine waveform of the first circuit scaled by the calibration scalar.

* * * * *